(12) United States Patent
Jiang et al.

(10) Patent No.: US 10,714,651 B2
(45) Date of Patent: Jul. 14, 2020

(54) SOLID-STATE NEUTRON DETECTOR

(71) Applicant: Texas Tech University System, Lubbock, TX (US)

(72) Inventors: Hongxing Jiang, Lubbock, TX (US); Jingyu Lin, Lubbock, TX (US); Jing Li, Lubbock, TX (US); Avisek Maity, Lubbock, TX (US); Sam Grenadier, Lubbock, TX (US)

(73) Assignee: Texas Tech University System, Lubbock, TX (US)

( * ) Notice: Subject to any disclaimer, the term of this patent is extended or adjusted under 35 U.S.C. 154(b) by 0 days.

(21) Appl. No.: 16/170,500

(22) Filed: Oct. 25, 2018

(65) Prior Publication Data
US 2020/0135958 A1   Apr. 30, 2020

(51) Int. Cl.
| | | |
|---|---|---|
| H01L 21/02 | (2006.01) |
| H01L 31/115 | (2006.01) |
| G01T 3/08 | (2006.01) |
| H01L 31/0224 | (2006.01) |
| H01L 31/036 | (2006.01) |
| H01L 31/02 | (2006.01) |
| H01L 31/18 | (2006.01) |
| H01L 31/0304 | (2006.01) |

(52) U.S. Cl.
CPC .............. *H01L 31/115* (2013.01); *G01T 3/08* (2013.01); *H01L 31/02019* (2013.01); *H01L 31/022408* (2013.01); *H01L 31/036* (2013.01); *H01L 31/03044* (2013.01); *H01L 31/1856* (2013.01); *H01L 31/1892* (2013.01)

(58) Field of Classification Search
CPC ........... H01L 21/02008; H01L 31/1892; H01L 31/1856
See application file for complete search history.

(56) References Cited

U.S. PATENT DOCUMENTS

| | | |
|---|---|---|
| 6,727,504 B1 | 4/2004 | Doty |
| 7,164,138 B2 | 1/2007 | McGregor et al. |
| 8,558,188 B2 | 10/2013 | Nikolic et al. |
| 8,778,715 B2 | 7/2014 | Bellinger et al. |

(Continued)

OTHER PUBLICATIONS

Ahmed, K. et al., "Solid-state neutron detectors based on thickness scalable hexagonal boron nitride" Appl. Phys. Lett. 110, 023503 Oct. 11, 2016.

(Continued)

*Primary Examiner* — Douglas M Menz
(74) *Attorney, Agent, or Firm* — Daniel J. Chalker; Edwin S. Flores; Chalker Flores, LLP (57) ABSTRACT

A method for fabricating a neutron detector includes providing an epilayer wafer of Boron-10 enriched hexagonal boron nitride (h-$^{10}$BN or h-BN or $^{10}$BN or BN) having a thickness (t), dicing or cutting the epilayer wafer into one or more BN strips having a width (W) and a length (L), and depositing a first metal contact on a first surface of at least one of the BN strip and a second metal contact on a second surface of the at least one BN strip. The neutron detector includes an electrically insulating submount, a BN epilayer of Boron-10 enriched hexagonal boron nitride (h-$^{10}$BN or h-BN or $^{10}$BN or BN) placed on the insulating submount, a first metal contact deposited on a first surface of the BN epilayer, and a second metal contact deposited on a second surface of the BN epilayer.

16 Claims, 9 Drawing Sheets

(56) References Cited

U.S. PATENT DOCUMENTS 9,093,581 B2     7/2015    Jiang et al.
9,151,853 B2    10/2015    Dahal et al.
9,810,794 B2    11/2017    Dahal

OTHER PUBLICATIONS

Bellinger, S. L. et al., "Improved High Efficiency Stacked Microstructured Neutron Detectors Backfilled With Nanoparticle 6LiF" IEEE Transactions on Nuclear Science, vol. 59, No. 1, Feb. 2012.

Bellinger, Steven L. et al. "High-efficiency microstructured semiconductor neutron detectors that are arrayed, dual-integrated, and stacked" Applied Radiation and Isotopes 70 (2012) 1121-1124.

Caruso, A. N. "The physics of solid-state neutron detector materials and geometries" J. Phys.: Condens. Matter 22 (2010) 443201 (32pp).

Dahal, Rajendra et al. "Anisotropic charge carrier transport in free-standing hexagonal boron nitride thin films" Applied Physics Express 9, 065801 (2016) 4 pages.

Doan, T.C. et al. "Growth and device processing of hexagonal boron nitride epilayers for thermal neutron and deep ultraviolet detectors" AIP Advances 6, 075213 (2016); doi: 10.1063/1.4959595.

Huang, Kuan-Chih et al. "Scalable large-area solid-state neutron detector with continuous p-n junction and extremely low leakage current" Nuclear Instruments and Methods in Physics Research A 763 (2014) 260-265.

Jun, I. et al. "Neutron background environment measured by the Mars Science Laboratory's Dynamic Albedo of Neutrons instrument during the first 100 sols" Journal of Geophysical Research: Planets, vol. 118, 2400-2412, doi:10.1002/2013JE004510, 2013.

Li, J. et al. "Hexagonal boron nitride epitaxial layers as neutron detector materials" Nuclear Instruments and Methods in Physics Research A 654 (2011) 417-420.

Maity, A. et al. "Realization of Highly Efficient Hexagonal Boron Nitride Neutron Detectors" 30. https://publishing.aip.org/publishing/journal-highlights/hexagonal-boron-nitride-semiconductors-enable-cost-effective-detection.

Maity, A. et al. "Toward achieving flexible and high sensitivity hexagonal boron nitride neutron detectors" Applied Physics Letters 111, 033507 (2017).

Noonan, William A. "Neutrons: It Is All in the Timing—The Physics of Nuclear Fission Chains and Their Detection" Johns Hopkins APL Technical Digest, vol. 32, No. 5 (2014) 762-773.

Osberg, Kevin et al. "A Handheld Neutron-Detection Sensor System Utilizing a New Class of Boron Carbide Diode" IEEE Sensors Journal, vol. 6, No. 6, Dec. 2006.

Shao, Q. et al. "High aspect ratio composite structures with 48.5% thermal neutron detection efficiency" Applied Physics Letters 102, 063505 (2013) 4 pages.

Spieler, H.G. et al. "Assessment of Present and Future Large-Scale Semiconductor Detector Systems" Presented at the IEEE 1984 Nuclear Science Symposium, Orlando, FL, Oct. 31-Nov. 2, 1984, Nov. 1, 1984.

Maity, A. et al. "Hexagonal boron nitride neutron detectors with high detection efficiencies" Journal of Applied Physics 123, 044501 (2018); doi: 10.1063/1.5017979.

Many, A. "High-Field Effects in Photoconducting Cadmium Sulphide" J. Phys. Chem. Solids Pergamon Press 1965. vol. 26, pp. 575-585.

Many, A. "Tunneling Processes Across the CdS-Electrolyte Interface" J. Phys. Chem. Solids Pergamon Press 1965. vol. 26, pp. 587-593.

Conway, Adam M. et al. "Numerical Simulations of Carrier Transport in Pillar Structured Solid State Thermal Neutron Detector" ISDRS 2007, Dec. 12-14, 2007, College Park, MD, USA, 2 pp.

McGregor, D.S. et al. "Thermal neutron detection with pyrolytic boron nitride" Nuclear Instruments and Methods in Physics Research A 591 (2008) 530-533.

Neal, John et al. "Evaluation of Neutron and Gamma Detectors for High-Temperature Well-Logging Applications" Future of Instrumentation International Workshop (FIIW) (2011), pp. 172-175.

Doan, T.C. et al. "Hexagonal boron nitride thin film thermal neutron detectors with high energy resolution of there action products" NuclearInstrumentsandMethodsinPhysicsResearchA783(2015)121-127.

Cao, X. K. et al. "Two-dimensional excitons in three-dimensional hexagonal boron nitride" Appl. Phys. Lett. 103, 191106 (2013); doi: 10.1063/1.4829026.

Losovyj, Ya B. et al. "The electronic structure change with Gd doping of Hf02 on silicon" Appl. Phys. Lett. 91, 132908 (2007); doi: 10.1063/1.2787967.

Flexible $h$-$^{10}$BN (50 µm thick)

Cross-sectional view

FIG. 6A

Side view

Detector dimension from 4-inch and 6-inch Wafer

(a) 6" wafer (152.4 mm)

FIG. 9B (a) 4" wafer (101.6 mm)

FIG. 9A

Side view
FIG. 10A

Top view
FIG. 10C

Cross-sectional view
FIG. 10B

SOLID-STATE NEUTRON DETECTOR

STATEMENT OF FEDERALLY FUNDED RESEARCH

This invention was made with government support under grant/contract number DE-AR0000964 awarded by the Department of Energy, Advanced Research Projects Agency-Energy (ARPA-E). The government has certain rights in the invention.

CROSS-REFERENCE TO RELATED APPLICATIONS

None.

TECHNICAL FIELD OF THE INVENTION

The present invention relates in general to the field of solid-state detectors and more specifically to solid-state neutron detectors and a method of fabricating solid-state neutron detectors.

BACKGROUND OF THE INVENTION

Without limiting the scope of the invention, its background is described in connection with neutron detectors.

Detection of neutrons is an exceedingly specific indicator of the presence of fissile materials. As such, neutron detectors are deployed at ports of entry throughout the US for the purpose of detecting and interdicting the movement of an illicit special nuclear material (SNM) or an actual nuclear device [1]. Neutron detectors are also an indispensable tool in geothermal and well-logging for the determination of the formation properties, including the porosity and water (and/or $H_2$) content [2]. Similarly, neutron detectors are also useful for planetary missions for remotely sensing the water (and/or $H_2$) content in the shallow subsurface and/or to determine the surface compositions of planetary bodies [3]. When a fast neutron emitted from a neutron generator strikes a hydrogen nucleus of equal mass, which is present in pore water/oil, it thermalizes. Modern neutron logging tools commonly count thermal and epithermal neutrons by employing pressurized $_2^3$He (He-3) gas tube detectors. To the first order, the thermal neutron count is inversely proportional to the hydrogen content (or the porosity) of the rocks. The most widely deployed neutron detectors are helium-3 gas detectors. This is because He-3 has a very high thermal neutron capture cross-section of 5330 barn [4]. However, being a gas, He-3 detectors are inherently bulky. Moreover, its scarcity has had an extreme effect on its price in recent days. Other shortcomings of He-3 detectors are the need of high pressurization (up to 20 atm for 2.25-inch diameter tubes), high voltage application (>1000 V) and slow response speed (~milliseconds). These attributes prohibit flexibilities in detector design and form factors and also increase measurements/exploration/logging time and costs. Additionally, He-3 gas detectors are most appropriate for operation below 175° C. For well logging, the trend is moving into deep and slim wells where temperatures easily exceed 250° C. For geothermal logging, the environmental conditions are even more extreme where temperatures can be as high as 500° C. Therefore, neutron detectors with enhanced capabilities of operating in extreme environments of high temperatures/mechanical vibration/shock are highly desirable. Solid-state thermal neutron detectors have recently been rapidly developed [5-22] for their obvious advantages including independence from $^3$He gas, compactness, and low voltage operation. Until this date, the most effective solid-state detector approach has been the micro-structured semiconductor neutron detector (MSND), which has been reported extensively in recent years [5-16]. This type of indirect conversion detector is composed of micro-structured Si filled with either $^{10}$B or $^6$LiF. The detection efficiency depends upon microstructure design, material choice, and depth of the reacting material. The most efficient micro-structured semiconductor based thermal neutron detector that has ever been reported consists of a $^{10}$B filled Si microstructure with an efficiency of 48.5% [8, 9]. On the other hand, stacked $^6$LiF filled Si detectors [6, 7, 11-13] with a certified detection efficiency of 30% have already been commercialized. The theoretical and actual attained detection efficiencies of these existing solid-state neutron detectors are limited by the intrinsic material properties and device architectures employed.

In recent years, single crystalline hexagonal boron nitride (h-BN) wide bandgap semiconductor has emerged as an attractive material for neutron detector applications [23-31]. This is due to the fact that single crystal h-BN films (or epilayers) can be synthesized by epitaxial growth techniques such as metal organic chemical vapor deposition (MOCVD) [23-30] and that the thermal neutron capture cross-section of Boron-10 ($^{10}$B) isotope is quite high ($\sigma$~3840 barns=3.84×$10^{-21}$ cm$^2$) [4]. Because it is composed of low atomic number elements, B(5) and N(7), h-BN's interaction with gamma photons is extremely low, which gives rise to an excellent gamma to neutron discrimination ratio below $10^{-6}$ [26, 28].

Figure 1:
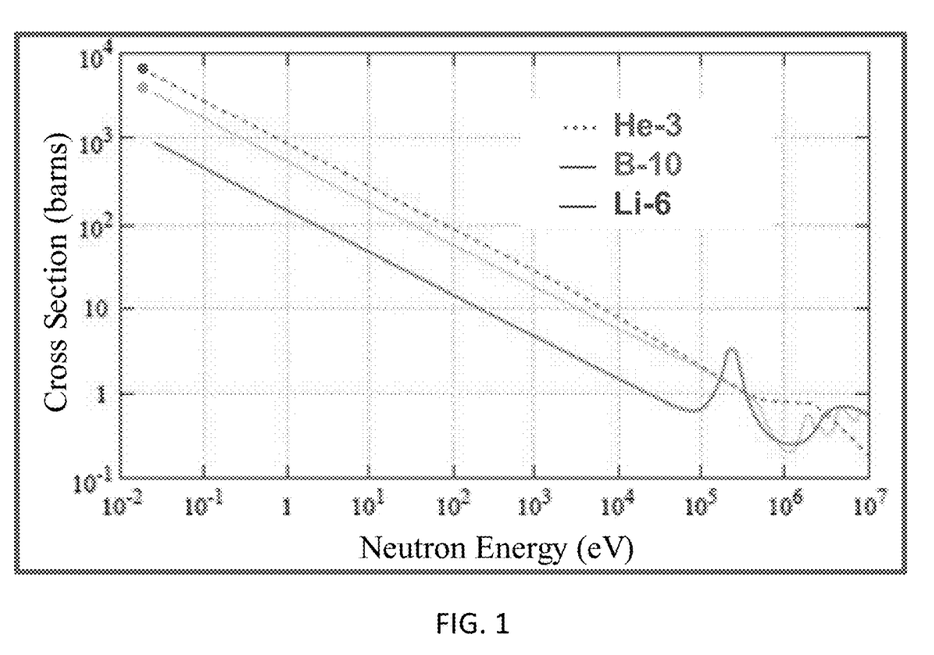
FIG. 1 is a plot of neutron capture cross sections as functions of the kinetic energy of neutrons for He-3, B-10, and Li-6.

The element B exists as two main isotopes, $^{10}$B and $^{11}$B in a natural abundance of approximately 20% and 80% respectively [4]. It is only the isotope $^{10}$B that can interact with neutrons. FIG. 1 is a plot of neutron capture cross sections as functions of the kinetic energy of neutrons for He-3 (green upper plot), B-10 (orange middle plot), and Li-6 (purple lower plot). FIG. 1 shows that $^{10}$B (orange middle plot) has a large capture cross section ($\sigma$) of about 3840 barn ($\sigma$=3.84×$10^{-21}$ cm$^2$) for thermal neutrons (neutrons with an energy=25 meV), which is only slightly smaller than a value of $\sigma$~5330 barns for He-3 gas atoms (green upper plot) [4]. [adopted from MIT OpenCourseWare—https://ocw.mit.edu/courses/nuclear-engineering/22-106-neutron-interactions-and-applications-spring-2010/lecture-notes/MIT22_106S10_lec07.pdf. (Slide 27)]. However, as a semiconductor, the density of atoms which can interact with thermal neutrons in 100% $^{10}$B-enriched BN ($^{10}$BN) is N($^{10}$B)=5.5×$10^{22}$/cm$^3$, which is about 550 times higher than that in He-3 gas pressurized at 4 atm. This provides an absorption coefficient for thermal neutrons in $^{10}$BN of $\alpha$=N$\sigma$=5.5×$10^{22}$×3.84×$10^{-21}$=211.2 cm$^{-1}$ and an absorption length of $\lambda$=$\alpha^{-1}$=47.3 μm [28-30]. This thickness is negligibly small compared to the dimensions of He-3 gas detectors which typically have diameters in inches.

Earlier h-BN neutron detectors, such as those disclosed in U.S. Pat. No. 9,093,581 which is hereby incorporated by reference in its entirety, were based on a metal-semiconductor-metal (MSM) architecture with micro-strip interdigital fingers fabricated on h-BN epilayers of several microns in thickness [24-27]. The photolithography technique was used to pattern the interdigital fingers on the surface of h-BN epilayers. Pattern transfer was accomplished using inductively-coupled plasma (ICP) dry etching. The patterns were etched all the way to the sapphire substrate. Metal contacts were deposited by e-beam evaporation. The detection efficiencies of these devices were limited to a few percent at the best since this type of MSM device architecture involves dry etching and is limited to the fabrication of very thin h-BN detectors. Moreover, a fraction of the detection area must be removed by dry etching in the MSM detectors, which sacrifices the overall detection sensitivity. Furthermore, dry etching also induces surface damages, which increases surface recombination and reduces the charge collection efficiency. Therefore, these MSM detectors are only suitable for initial conceptual demonstration. Accordingly, a need remains in the art for solid-state neutron detectors.

SUMMARY OF THE INVENTION

The present invention relates to the design and fabrication of a solid-state neutron detector which is capable to provide high quantum efficiency and detection sensitivity and to operate in harsh environments (including high temperature and high pressure). These detectors are fabricated from single crystal boron nitride (BN) semiconductors in thin film form with large thicknesses to support an intrinsic detection efficiency approaching 100%. High detection sensitivity is accomplished via lateral conduction and detector array configurations to provide a high charge collection efficiency and large detection area. These detectors are able to withstand extremely high temperatures due to the fact that these materials possess high thermal conductivity and large energy bandgap and that they are synthesized at very high temperatures. These BN neutron detectors are more durable and require much lower voltages and power consumption and no pressurization compared to the He-3 gas detectors, thereby providing significant reduction in size and weight, more versatile form factors, faster response speed, higher reliability, and lower costs for fabrication/operation/maintenance over those of He-3 gas detectors for many applications, including in the areas of detection of nuclear materials, geothermal and well logging, and planetary missions.

One embodiment of the present invention provides a method for fabricating a neutron detector by providing an epilayer wafer of Boron-10 enriched hexagonal boron nitride (h-$^{10}$BN or h-BN or $^{10}$BN or BN) having a thickness (t), dicing or cutting the epilayer wafer into one or more BN strips having a width (W) and a length (L), and depositing a first metal contact on a first surface of at least one of the BN strips and a second metal contact on a second surface of the at least one BN strip.

In one aspect, the method includes connecting the first metal contact and the second metal contact to a measurement circuit. In another aspect, the method includes measuring a plurality of neutrons using the neutron detector. In another aspect, the method includes using the neutron detector to detect nuclear materials, to perform geothermal and/or well logging, or perform planetary missions. In another aspect, the method includes placing the at least one BN strip onto an electrically insulating submount prior to depositing the first metal contact and the second metal contact; and wherein the first surface comprises a side of the at least on BN strip and the second surface comprises an opposite side of the at least one BN strip such that the neutron detector comprises a lateral oriented neutron detector. In another aspect, the first metal contact and the second metal contact each overlaps a top edge of the at least one BN strip. In another aspect, the method includes repeating the placing step and depositing step such that a plurality of BN strips are placed end to end onto the electrically insulating submount in a series configuration. In another aspect, the method includes repeating the placing step and depositing step such that a plurality of the neutron detectors are placed onto the electrically insulating submount in a parallel configuration. In another aspect, depositing the first metal contact on the first surface of the at least one BN strip and the second metal contact on the second surface of the at least one BN strip includes: depositing a first metal contact onto an electrically insulating submount; placing the first surface comprising a bottom surface of the at least one BN strip onto the first metal contact; and depositing the second metal contact onto the second surface comprising a top surface of the at least one BN strip such that the neutron detector comprises a vertical oriented neutron detector. In another aspect, depositing the first metal contact on the first surface of the at least one BN strip and the second metal contact on the second surface of the at least one BN strip is preformed using an electron-beam evaporation, thermal evaporation, electroplating or pasting process. In another aspect, the one or more BN strips comprise at least two strips, each strip having the width (W) and at least two lengths ($L_1$, $L_2$). In another aspect, the thickness of the epilayer wafer comprises several microns to greater than 300 µm. In another aspect, providing the epilayer wafer includes: providing a substrate; growing the epilayer wafer on the substrate; and removing the epilayer wafer from the substrate. In another aspect, removing the epilayer wafer from the substrate includes cooling the epilayer wafer and the substrate after crystal growth such that a difference in thermal expansion coefficients between the epilayer wafer and the substrate automatically separates the epilayer wafer from the substrate. In another aspect, the epilayer wafer is flexible. In another aspect, the neutron detector has one or more characteristics comprising an operating voltage that can be less than about 500 V, an operating temperature between about −200 and 500 C, a gamma rejection ratio of about $1 \times 10^{-4}$ or better, or an energy resolution of about 3% or better.

Another embodiment of the present invention provides a neutron detector that includes an electrically insulating submount, a BN epilayer of Boron-10 enriched hexagonal boron nitride (h-$^{10}$BN or h-BN or $^{10}$BN or BN) placed on the insulating submount, a first metal contact deposited on a first surface of the BN epilayer, and a second metal contact deposited on a second surface of the BN epilayer.

In one aspect, a measurement circuit is connected to the first metal contact and the second metal contact. In another aspect, the first surface comprises a side of the BN epilayer and the second surface comprises an opposite side of the BN epilayer such that the neutron detector comprises a lateral oriented neutron detector. In another aspect, the first metal contact and the second metal contact each overlaps a top edge of the BN epilayer. In another aspect, the BN epilayer comprises a plurality of BN strips placed end to end onto the electrically insulating submount in a series configuration, and each BN strip having the first metal contact and the second metal contact. In another aspect, the BN epilayer comprises a plurality of the BN strips placed onto the electrically insulating submount in a parallel configuration, and each BN strip having the first metal contact and the second metal contact. In another aspect, the first surface comprising a bottom surface of the BN epilayer, the second metal contact is disposed onto the second surface comprising a top surface of the BN epilayer, and the neutron detector comprises a vertical oriented neutron detector. In another aspect, the first metal contact and the second metal contact are deposited using an electron-beam evaporation, thermal evaporation, electroplating or pasting process. In another aspect, the BN epilayer comprises at least two BN strips, each BN strip having a width (W) and at least two lengths ($L_1$, $L_2$). In another aspect, a thickness of the BN epilayer comprises from several microns to greater than 300 µm. In another aspect, the neutron detector has one or more characteristics comprising an operating voltage that can be less than about 500 V, an operating temperature between about −200 and 500 C, a gamma rejection ratio of 1×10$^{-4}$ or better, or an energy resolution of about 3% or better. In another aspect, the neutron detector is integrated into a nuclear material detection device, a geothermal and/or well logging device, or a planetary mission device

BRIEF DESCRIPTION OF THE DRAWINGS

For a more complete understanding of the features and advantages of the present invention, reference is now made to the detailed description of the invention along with the accompanying figures and in which.

DETAILED DESCRIPTION OF THE INVENTION

While the making and using of various embodiments of the present invention are discussed in detail below, it should be appreciated that the present invention provides many applicable inventive concepts that can be embodied in a wide variety of specific contexts. The specific embodiments discussed herein are merely illustrative of specific ways to make and use the invention and do not delimit the scope of the invention.

To facilitate the understanding of this invention, a number of terms are defined below. Terms defined herein have meanings as commonly understood by a person of ordinary skill in the areas relevant to the present invention. Terms such as "a", "an" and "the" are not intended to refer to only a singular entity, but include the general class of which a specific example may be used for illustration. The terminology herein is used to describe specific embodiments of the invention, but their usage does not limit the invention, except as outlined in the claims.

The present invention is related to the design and fabrication of $^{10}$BN solid-state detectors. Compared to He-3 tube detectors, BN detectors will provide significant performance enhancements, as summarized in Table 1, which include increased detection efficiency and operating temperature and ruggedness, reduced size and weight, no pressurization, lower operating voltage and power consumption, and larger/faster signals in extreme environments, and consequently decrease the exploration/logging time and the costs of operation/maintenance and potentially enable logging tools to operate in harsh environments where He-3 detectors are not capable to operate. In particular, this invention provides $^{10}$BN solid-state detectors with high detection efficiencies and sensitivities.

TABLE 1

Characteristics comparison between He-3 gas tube detectors and $^{10}$BN detectors

|  | He-3 gas detector | $^{10}$BN semiconductor detector |
|---|---|---|
| Nuclear reaction | $^{3}$He + $^{1}$n = $^{1}$H (573 keV) + $^{3}$H (191 keV) | $_{5}^{10}$B + $_{0}^{1}$n = $_{3}^{7}$Li* (0.84 MeV) + $_{2}^{4}$α* (1.47 MeV), 94% $_{5}^{10}$B + $_{0}^{1}$n = $_{3}^{7}$Li (1.015 MeV) + $_{2}^{4}$α (1.777 MeV), 6% Li, α → N (e$^{-}$) + N (h$^{+}$), N~10$^{5}$ |
| Intrinsic efficiency for (0.025 eV) thermal neutrons | 77% (φ = 1" @ 4 atm) | 95% (@140 µm thickness) |
| Intrinsic efficiency for (0.4 eV) epithermal neutrons | 20% (φ = 1" @ 4 atm) | 63% (@200 µm thickness) |
| Method for increasing sensitivity | Increase gas tube diameter, length, pressure | Increase the thickness and total detection area of $^{10}$BN detector chip |
| Response speed | ~1 ms | ~1 ns |
| Operating voltage (V) | >1000 | <500 (<100) |
| Typical operating temperature, ° C. | −50 to +150 | −200 to +500 |
| Gamma rejection ratio | ~1 × 10$^{-4}$ | ~1 × 10$^{-4}$ (~1 × 10$^{-6}$) |

TABLE 1-continued

Characteristics comparison between He-3 gas tube detectors and ¹⁰BN detectors

| | He-3 gas detector | ¹⁰BN semiconductor detector |
|---|---|---|
| Vibration response | Movement causes spurious pulses | Semiconductor packages immune to vibration |
| Energy resolution | 6% | 3% |
| Active volume ratio for equivalent sensitivity | 300-500 (depending on the gas tube diameter and pressure) | 1 |
| Cost for equivalent sensitivity | $2,400 (ϕ = 1"; L = 25 cm @ 4 atm) | ~$240 (2 × 2" wafers, 80 µm thick) |

Notes:
Both He-3 & BN detectors are nearly insensitive to fast neutrons (neutrons with E > 0.1 MeV).
Scintillator detectors are sensitive to both thermal neutrons and gamma photons and require additional methods to discriminate thermal neutrons from gamma photons, which are not preferred in modern neutron logging tools and may be more suitable for gamma-ray logging.

Figure 2:
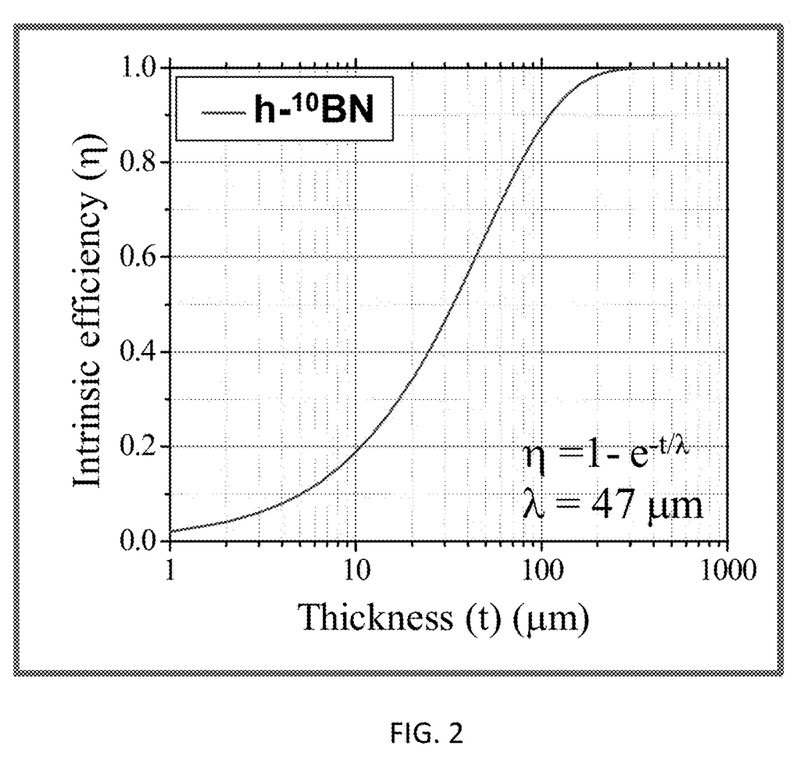
FIG. 2 is a plot of the theoretical thermal neutrons detection efficiency of 100% 10B-enriched h-BN with respect to film thickness.

The thermal neutron absorption probability (P) or the theoretical detection efficiency (ii) of ¹⁰BN detectors as a function the detector's layer thickness, t, can be expressed as [28, 29]

$$\eta = P(t) = 1 - e^{-t/\lambda}, \quad (1)$$

where $\lambda = 47.3$ µm (thermal neutron absorption length). Eq. (1) is plotted in FIG. 2, which shows that the efficiency of ¹⁰BN detectors can be increased by simply increasing the layer thickness. This is in sharp contrast to He-3 gas detectors in which the enhancement in the detection sensitivity is achieved through increasing the gas tube diameter, length and gas pressure. As indicated in FIG. 2, BN detectors with a layer thickness of 3λ (▫ 140 µm) can attain a theoretical detection efficiency of 95%, whereas BN detectors with a layer thickness of t>300 µm can attain a theoretical detection efficiency approaching 100%.

Figure 3:
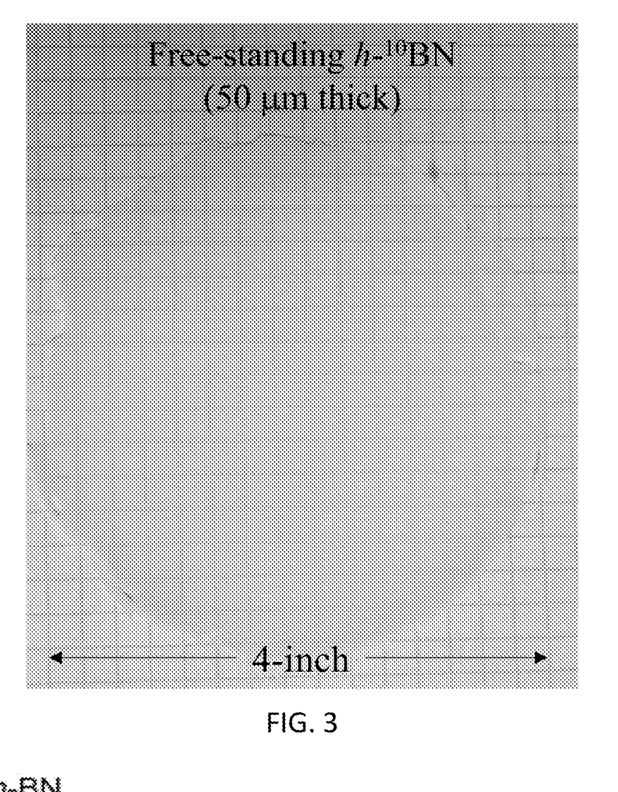
FIG. 3 is a photo of a 4-inch freestanding 10BN wafer of 50 µm in thickness produced in accordance with one embodiment of the present invention.

As shown in FIG. 3, a freestanding and single crystal of 100% Boron-10 enriched hexagonal boron nitride (abbreviated as h-¹⁰BN or h-BN or ¹⁰BN or BN hereafter) epilayer wafers of 4-inches in diameter with large thicknesses (>30 µm) has been successfully produced. Due to the unique layered structure of h-BN (FIG. 4A) and the difference in thermal expansion coefficients between h-BN and substrate, h-BN epilayers with a sufficient thickness automatically separate from substrates during cooling down after growth, forming freestanding h-BN wafers. As demonstrated in FIG. 4B, freestanding BN epilayers are quite flexible. Photoconductive-type of vertical detectors 500 such as that shown in FIGS. 5A and 5B can be easily constructed from these freestanding wafers. The fabrication processes include two steps: dicing (or cutting) ¹⁰BN wafers into desired shapes and dimensions 502 followed by top contact 504 and bottom contact 506 deposition (e.g., Ni/Au (15 nm/20 nm)). The top and bottom contacts 502, 504 are then connected to a measurement circuit 508.

Figure 5A:
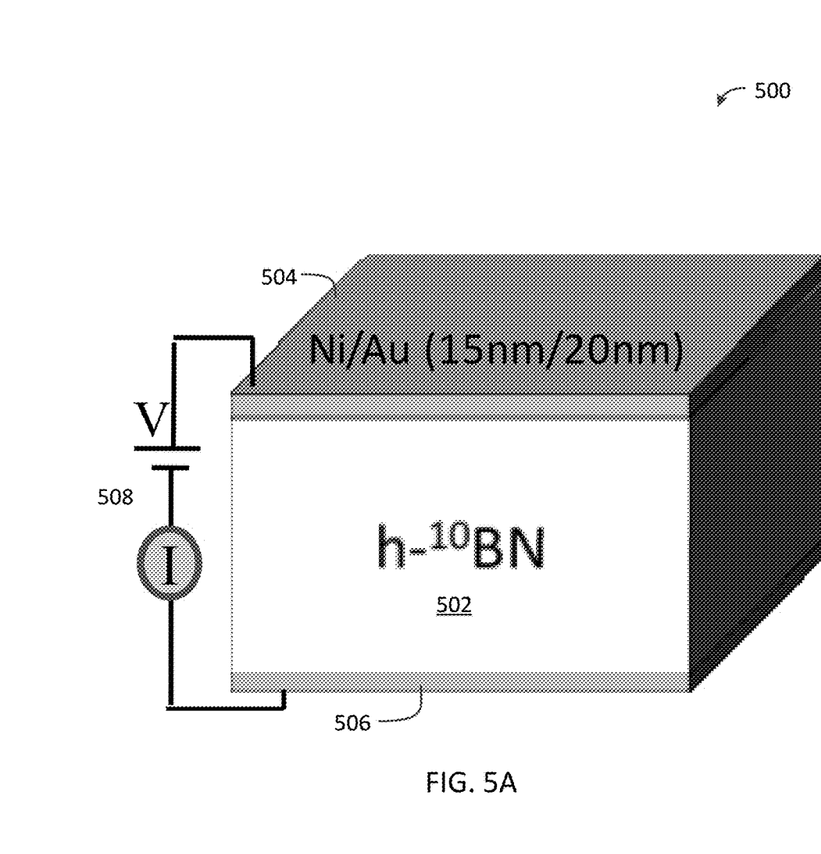
FIG. 5A is a schematic diagram of a photoconductive-type vertical $^{10}$BN neutron detector in accordance with one embodiment of the present invention.

The vertically oriented neutron detector 500 includes a BN epilayer 502 having a first surface (bottom surface) and a second surface (top surface), a first metal contact 506 disposed on the first surface (bottom surface) of the BN epilayer 502, and a second metal contact 504 deposited on a second surface (top surface) of the BN epilayer 502. The BN epilayer 502 is Boron-10 enriched hexagonal boron nitride having a thickness (t), a width (W) and a length (L). A measurement circuit 508 is connected to the first metal contact 506 and the second metal contact 504.

The first metal contact 506 and the second metal contact 504 can be deposited using an electron-beam evaporation, thermal evaporation, electroplating or pasting process. The thickness of the BN epilayer 502 can be from about a few microns to greater than 300 µm. The neutron detector 500 has one or more characteristics, such as an operating voltage less than about 500 V, an operating temperature between about −200 and 500 C, a gamma rejection ratio of about 1×10⁻⁶, or an energy resolution of about 3%. In some embodiments, the operating voltage less than about 100 V or the gamma rejection ratio is better than about 1×10⁻⁴.

Figure 5B:
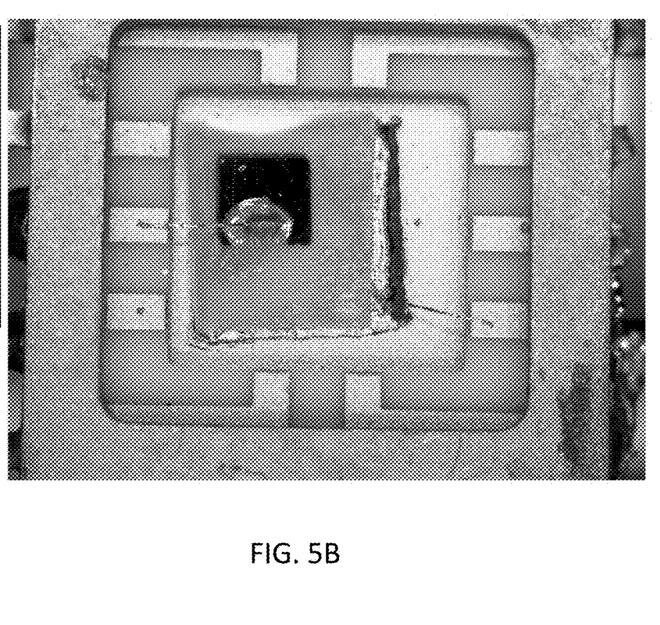
FIG. 5B is a photo of a packaged photoconductive-type vertical $^{10}$BN neutron detector in accordance with one embodiment of the present invention.
Figure 5C:
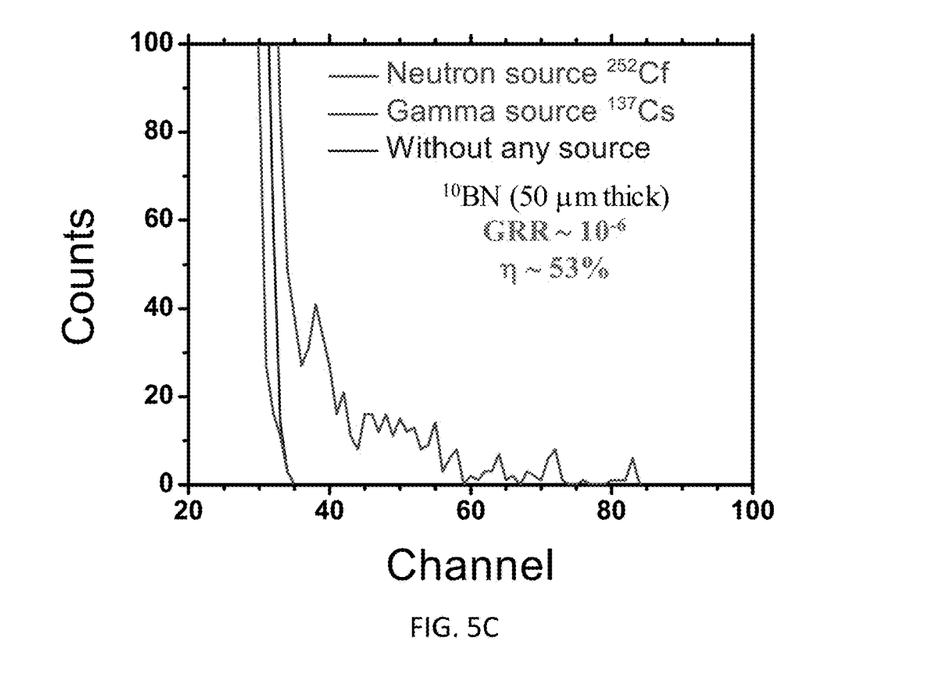
FIGS. 5C and 5D show plots of pulse height spectra of a 50 µm thick $^{10}$BN detector in response to a $^{252}$Cf neutron source moderated by a high density polyethylene (HDPE) block (red curve) and to 0.662 MeV gamma-photons produced by $^{137}$Cs decay (green curve).
Figure 5D:
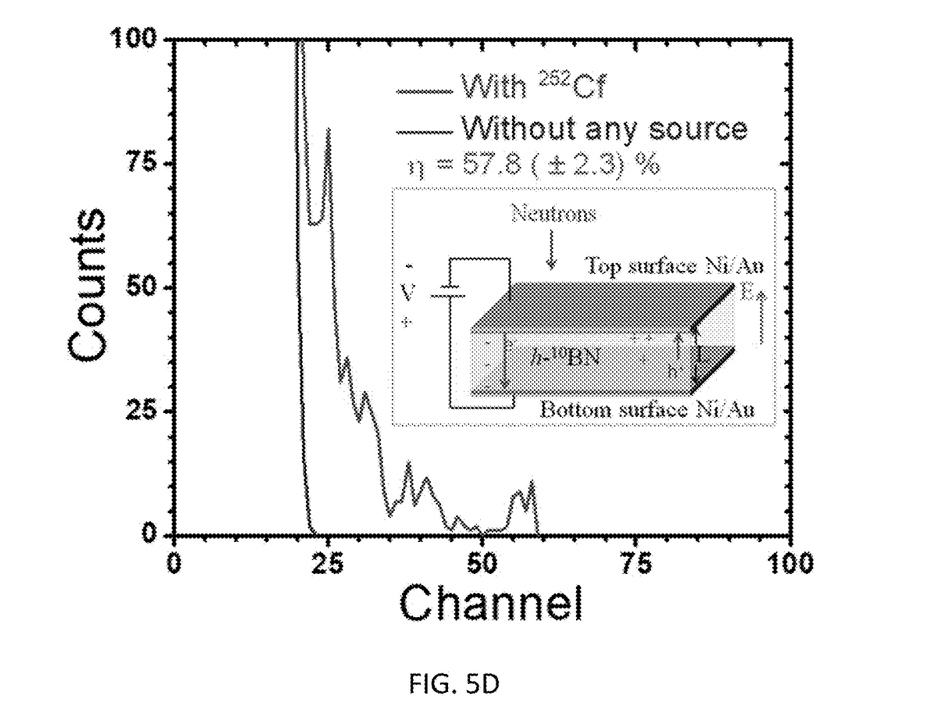

As shown in FIGS. 5C and 5D, neutron detectors fabricated from 50 µm thick ¹⁰BN epilayers possess a record high thermal neutron detection efficiency among solid-state neutron detectors (range from 53%-58%) and a gamma rejection ratio (GRR) of better than 10⁻⁶ [28-30]. In FIG. 5C, the green left most curve plots the counts to channel with a ¹³⁷Cs gamma source, the blue center-curve plots the counts to channel without any source, and the red right most curve plots the counts to channel with a ²⁵²Cf neutron source. In FIG. 5D, the blue left most curve plots the counts to channel without any source, and the red right most curve plots the counts to channel with a ²⁵²Cf neutron source The operating principle of BN neutron detectors is based on the fact that absorption of a neutron by a ¹⁰B atom induces the following nuclear reaction inside ¹⁰BN [4], $$_5{}^{10}B + _0{}^1n = _3{}^7Li^*(0.84 \text{ MeV}) + _2{}^4\alpha^*(1.47 \text{ MeV}) \; [94\% \text{ excited state}] \quad (2a)$$

$$_5{}^{10}B + _0{}^1n = _3{}^7Li^*(1.015 \text{ MeV}) + _2{}^4\alpha(1.777 \text{ MeV}) \; [6\% \text{ ground state}] \quad (2b)$$

$$Li, \alpha \rightarrow N(e^-) + N(h^+) \quad N \sim 10^5 \quad (3)$$

The detection of neutrons by a BN detector is accomplished by two sequential processes. The first is the neutron absorption described by Eq. (2) in which the nuclear reaction creates Li and α daughter particles with large kinetic energies. The second process of Eq. (3) is the charge carrier generation by Li and α particles and the subsequent collection of charge carriers [electrons (e⁻) and holes (h⁺)]. In contrast to ⁶LiF [6, 7, 11-13] or ¹⁰B [8, 9, 14-16] filled micro-structured semiconductor neutron detectors, the two sequential processes described by Eqs. (2) and (3) occur in the same BN layer. Therefore, BN detectors are considered as direct conversion neutron detectors and are capable to provide high charge collection efficiency and hence high detection efficiency for thermal neutrons. On the other hand, the unique properties that set single crystal BN material apart from other direct conversion neutron detectors based on amorphous B₄C [17], gadolinium complexes [18], pyrolytic and polycrystalline BN, and alpha rhombahedral boron complexes [19-22] include: (1) hexagonal BN has a simple crystal structure, which allows for the attainment of single crystalline thin films by epitaxial growth techniques such as MOCVD and (2) materials with single crystalline structure contain few charge traps and allow a rapid sweep-out of the electrons and holes generated by the nuclear reaction and high charge collection efficiency. Moreover, due to the high thermal conductivity and high melting point of BN, BN detectors are able to withstand extremely high temperatures.

Because the neutron flux in the relevant environments is usually low, high sensitivity detectors are desired for practical applications. The detection sensitivity of a detector, or the count rate ($C_R$) detected by a detector, is proportional to its detection efficiency (η) and area (A), i.e., $$C_R \sim \eta A. \quad (4)$$

Therefore, scaling up the detector size while maintaining a high detection efficiency is necessary to enhance the detection sensitivity. For the vertical device architecture shown in FIG. 5A, due to the large contact area between the metal contacts and the BN detector material, there are several technical challenges to scale up to large size detectors. These include: (1) The dark current (or leakage current) tends to increase with an increase of the detector area for a fixed bias voltage; (2) The capacitance also increases with increasing the detector area; and (3) The effect of surface recombination increases with increasing the contact area. It was shown that the equivalent noise of the measurement circuit increases linearly with increasing the leakage current and quadratically with increasing the capacitance [32]. The presence of a large noise in the measurement circuit will have a detrimental effect on detecting the actual signal, whereas an increase in the number of surface charge carrier traps will decrease the efficiency of charge collection described by Eq. (3). All of these will have consequences on the overall efficiency of the detector.

Figure 4A:
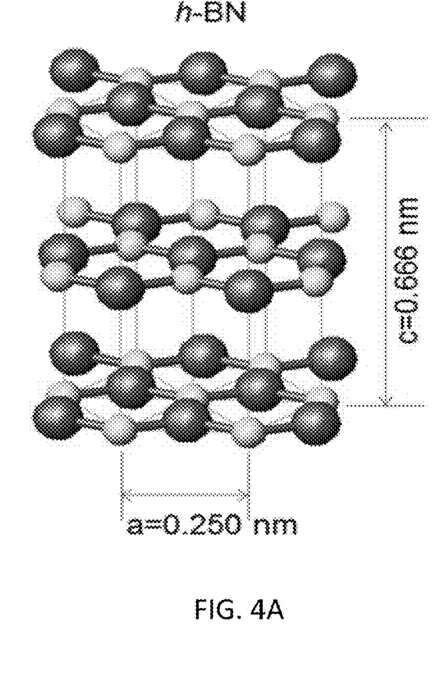
FIG. 4A is a schematic illustration of crystal structure of hexagonal BN in accordance with one embodiment of the present invention.

It is also critically important to understand the charge collection process described by Eq. (3). Most of the neutron-generated charge carriers, electrons (e) and holes (h⁺) inside a detector can be collected by the electrodes when the condition of the recombination time ($\tau$)≥the transit time ($\tau_t$) is satisfied, i.e., $\mu\tau \geq W^2/V\tau_t = W/\mu E, E=V/W$, or equivalently $$E \geq \frac{W}{\mu\tau}, \text{ or} \quad (5a)$$

$$V \geq \frac{W^2}{\mu\tau}, \text{ or} \quad (5b)$$

$$W \leq \sqrt{V\mu\tau}, \quad (5c)$$

where $\mu$ is the charge carrier mobility, $\tau$ is the mean lifetime of charge carriers, W is the carrier transit distance, and E (V) is the applied electric field (bias voltage). Note that the carrier transit distance (W) is equal to the thickness (t) of the detector for vertical oriented detectors. Eq. (5) implies that the required bias voltage to achieve the same charge collection efficiency is inversely proportional to the mobility-lifetime product ($\mu\tau$) of the detector material, whereas the quantity of $\mu\tau$ is strongly influenced by the overall material quality. As illustrated in FIG. 4A, it is well known that hexagonal boron nitride is a layer structured material, in which very different bonding, i.e., strong covalent bonding within the basal planes and weak bonding between planes, leads to anisotropy in electronic transport properties. It was shown that the mobility-lifetime products ($\mu\tau$) for both electrons and holes can be three orders of magnitude larger in the lateral direction (within the basal planes) than in the vertical direction (between planes) [33]. As such, the lateral device architecture of this invention shown in FIGS. 6A-6B which utilizes the lateral transport properties is preferred over that of the vertical devices (such as that shown in FIG. 5A). According to Eq. (5), for the same carrier transit distance, the lateral detectors in principle would require 1000 times lower bias voltage than the vertical detectors to attain a similar detection efficiency. Furthermore, compared to the vertical devices shown in FIG. 5A, the surface recombination effects are eliminated in lateral detectors shown in FIGS. 6A-6B due the minimal contacts between the electrodes and the detector's surface. The present invention therefore provides high efficiency and high sensitivity BN neutron detectors via the formation of lateral detectors.

Figure 4B:
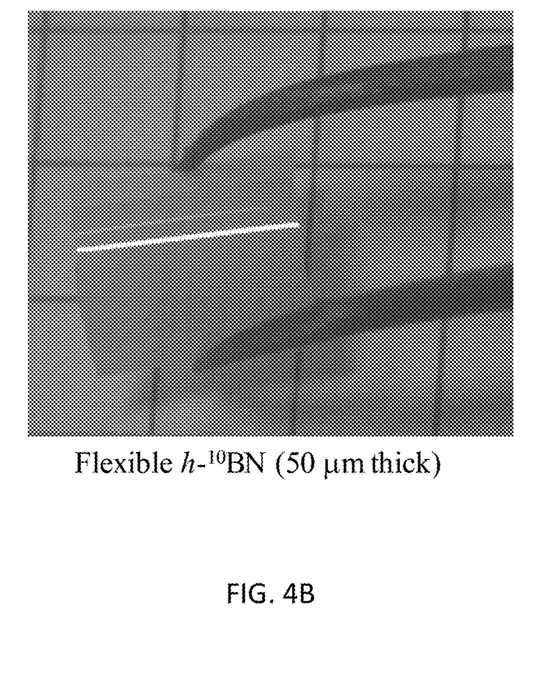
FIG. 4B is a photo of a piece of free-standing 100% B-10 enriched BN (10BN) epilayer showing its flexibility in accordance with one embodiment of the present invention.
Figure 6A:
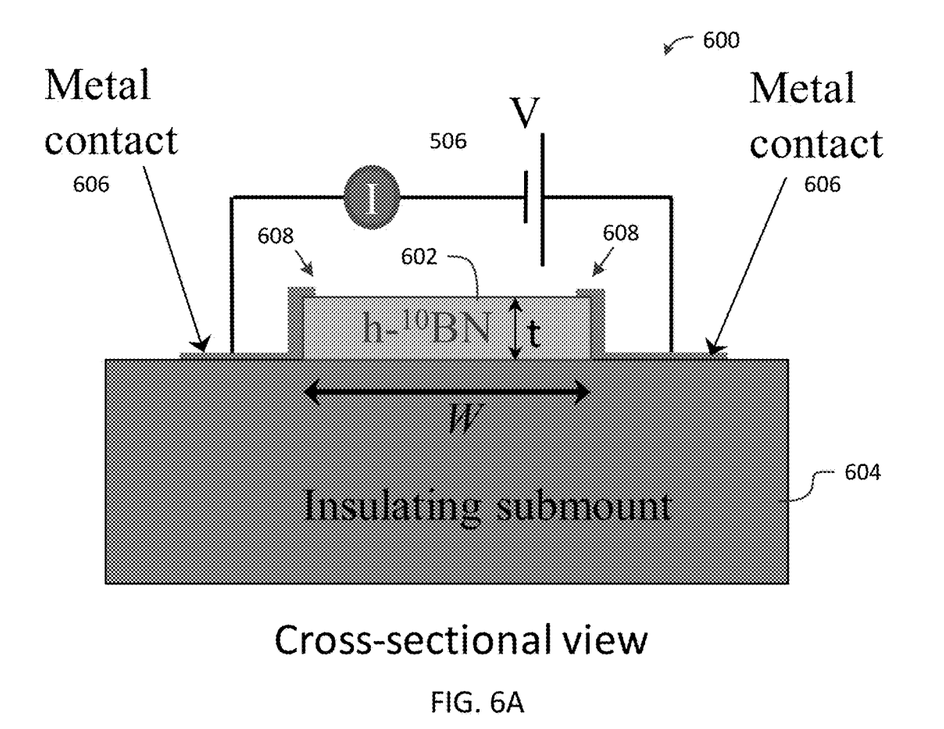
FIGS. 6A and 6B are schematic diagrams a cross-sectional view and side view, respectively, of a photoconductive-type lateral $^{10}$BN neutron detector with a width of W and length L in accordance with one embodiment of the present invention.
Figure 6B:
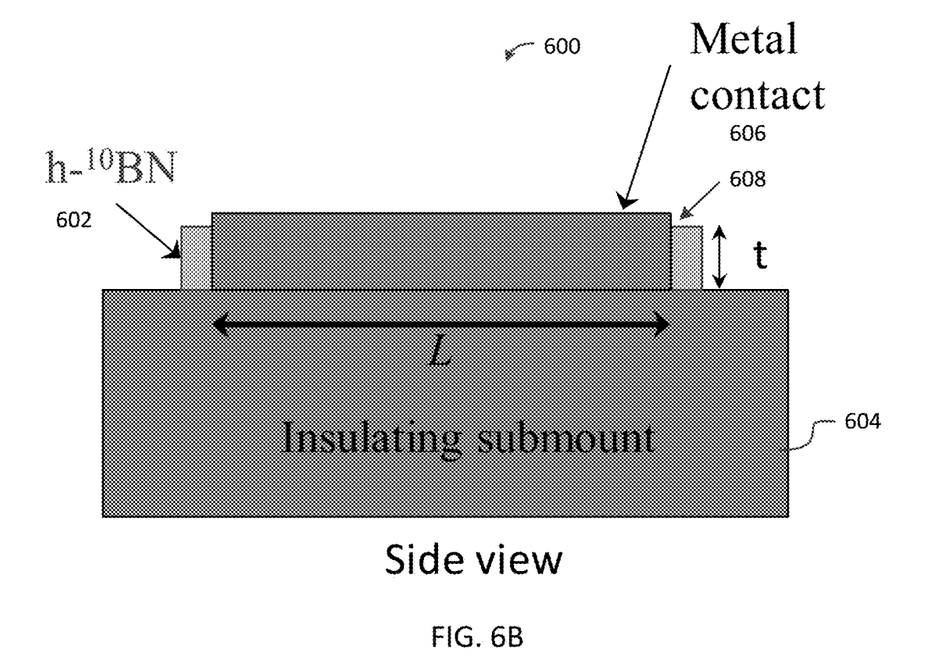
Figure 7:
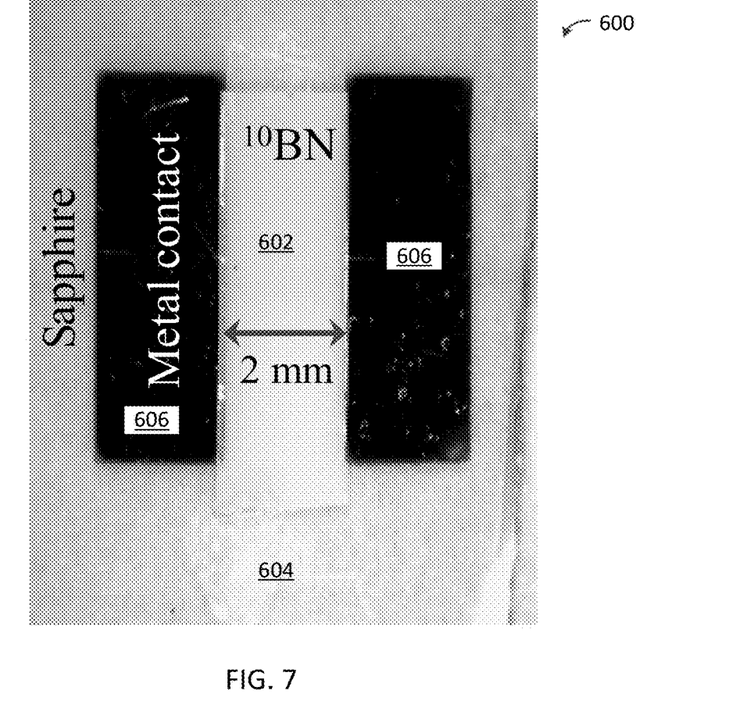
FIG. 7 is a photo of a fabricated photoconductive-type lateral $^{10}$BN neutron detector with a width of W and length L in accordance with one embodiment of the present invention.

As shown in FIG. 4B, freestanding BN epilayers are flexible. A lateral detector 600 can be formed by simply dicing or cutting a BN wafer into strips and placing a BN strip 602 (with a width W and length L) onto an electrically insulating submount 604 followed by metal contact deposition covering the strip edges 608, as illustrated in FIGS. 6A-6B. The electrical contacts 606 and 608 on BN films and the electrodes must be sufficiently electrically conducting so that the free carrier generated by nuclear reaction is not blocked from flowing into the external measurement circuit. Hence, low-resistance contacts are needed. This will ensure that essentially all of the electric field applied will be across the BN detectors, as needed to sweep out the free charge carriers. The metal contact type used in FIG. 5A provides just one working example. Many others metals may also be suitable to serve as the metal contacts on BN detectors. The lateral detector 600 is then connected to a measurement circuit 506. FIG. 7 shows photo of a lateral detector 600 fabricated from a freestanding h-10BN of the present invention as described in FIGS. 6A-6B in which the insulating submount 604 is sapphire. Other materials can be used for the insulating submount 604.

Figure 8:
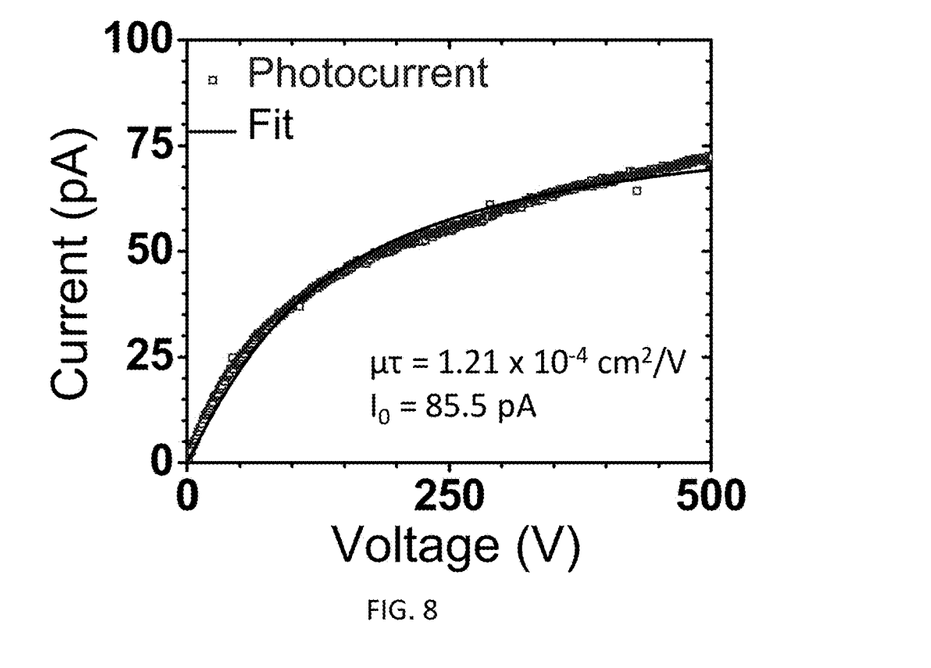
FIG. 8 is a plot of the photocurrent characteristics of a lateral $^{10}$BN neutron detector in accordance with one embodiment of the present invention.

In the lateral detector 600 of FIGS. 6A-6B, the desired width (W) is determined by the relation of Eq. (5) to ensure charge carrier collection. In the lateral direction, it can be assumed that the $\mu\tau$ products for electrons and holes are identical due to the fact that the effective masses of electrons and holes in single sheet h-BN are identical (around $0.54m_o$) [34]. A higher material quality translates to a large value of $\mu\tau$ product, which allows for a wider W and hence higher detection sensitivity under a fixed bias voltage. Assuming that the $\mu\tau$ products for electrons and holes are identical, the $\mu\tau$ product can be determined from the I-V characteristics under photoexcitation based on a modified Many's equation for lateral charge transport [35], $$I(V) = I_0 \frac{2\mu\tau V}{W^2} \left[ 1 - \frac{\mu\tau V}{W^2} \left( 1 - e^{-\frac{W^2}{\mu\tau V}} \right) \right] \quad (6)$$

where V is the applied voltage and W is the detector's width (or carrier transit distance). FIG. 8 shows the I-V characteristics under photoexcitation for one of the BN lateral detectors of this invention and the fitting between experimental data and the Many's Equation yields a value of $\mu\tau$ product of about $1\times10^{-4}$ cm²/V. This means that at a bias voltage of 400 V the width of the detector must be made to satisfy the condition of $W^2 \leq V_{\mu\tau}$ (=400 V×10⁻⁴ cm²/V=0.04 cm² or W≤0.2 cm) in order to ensure a sufficient charge carrier collection. Since the development of freestanding thick h-¹⁰BN epilayers is in an early stage, we anticipate significant enhancement in material quality as well as in the $\mu\tau$ products. To put thing into a perspective, roughly an order enhancement in $\mu\tau$ value would allow the detector width W to increase to 6 mm ($W^2 \leq V \cdot \mu\tau$=400 V×10⁻³ cm²/V=0.4 cm², W≤0.63 cm), which effectively also increases the detection area and hence the detection sensitivity by 3 times.

The theoretical detection efficiency ($\eta$) of these lateral detectors is determined by the detector's layer thickness (t) according to Eq. (1), whereas the overall detection sensitivity depends on both the detection efficiency ($\eta$) and the device area (A=W☐L) according to Eq. (4). It is important to point out that there is no limit in the sensitivity of a detector since it can be increased through increases in both the width (W) and length (L) of the detector. For BN wafers with a fixed $\mu\tau$ product and hence a predetermined W based on Eq. (5), in order to increase the overall detection sensitivity, one just needs to increase the length (L) of the detector. Therefore, it is much easier to scale up the detection size for lateral detectors of the present invention compared to the vertical detectors [22-24]. Very high sensitivity detectors can be obtained using very long lateral (or strip detectors).

For benchmarking purpose, the commercially available micro-structured semiconductor neutron detector (MSND) from Radiation Detection Technologies, Inc. was constructed from a 2×2 detector array with a specified a detection efficiency of 30% for thermal neutrons and with an effective device area of 4 cm², which provides a relative detection sensitivity of 1.2 ($C_R$~ηA4=4 cm²×30%). A BN lateral detector incorporating an epilayer with a thickness greater than 140 μm can potentially provide a detection efficiency approaching 90%. To attain a similar detection sensitivity of 1.2 as the MSND, BN lateral detectors with a μτ product of $1 \times 10^{-4}$ cm²/V and a width of W=2 mm need to have a length of L=6.6 cm in order to provide a comparable detection sensitivity of 1.2 as the MSND. On other hand, BN lateral detectors with a μτ product of $1 \times 10^{-3}$ cm²/V and a width of W=6 mm only need a length of L=2.2 cm in order to provide a comparable detection sensitivity of 1.2 as the MSND.

The laterally oriented neutron detector 600 includes an electrically insulating submount 604, a BN epilayer 602 placed on the insulating surmount 604, a first metal contact 606 deposited on a first surface (side) of the BN epilayer 602, and a second metal contact 608 deposited on a second surface (opposite side) of the BN epilayer 602. The BN epilayer 602 is Boron-10 enriched hexagonal boron nitride having a thickness (t), a width (W) and a length (L). A measurement circuit 506 is connected to the first metal contact 606 and the second metal contact 608. The first metal contact 606 and the second metal contact 608 each overlaps a top edge 610 of the BN epilayer 602.

The first metal contact 606 and the second metal contact 608 can be deposited using an electron-beam evaporation, thermal evaporation, electroplating or pasting process. The thickness of the BN epilayer 602 can be from about several microns to greater than 300 μm. The neutron detector 600 can have one or more characteristics, such as an operating voltage that can be less than about 500 V, an operating temperature between about −200 and 500 C, a gamma rejection ratio of about $1 \times 10^{-6}$, or an energy resolution of about 3%. In some embodiments, the operating voltage less than about 100 V or the gamma rejection ratio is better than about $1 \times 10^{-4}$. The neutron detector 600 can be integrated into a nuclear material detection device, a geothermal and/or well logging device, or a planetary mission device.

Figure 9A:
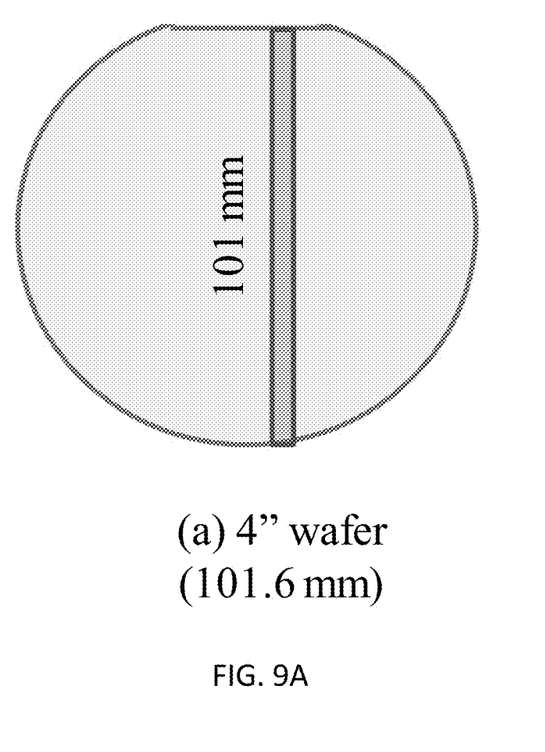
FIGS. 9A and 9B are schematic diagrams illustrating the attainment of detector strips with a width W from 4-inch and 6-inch BN wafers, respectively, to realize large effective detection area and detection sensitivity in accordance with one embodiment of the present invention.
Figure 9B:
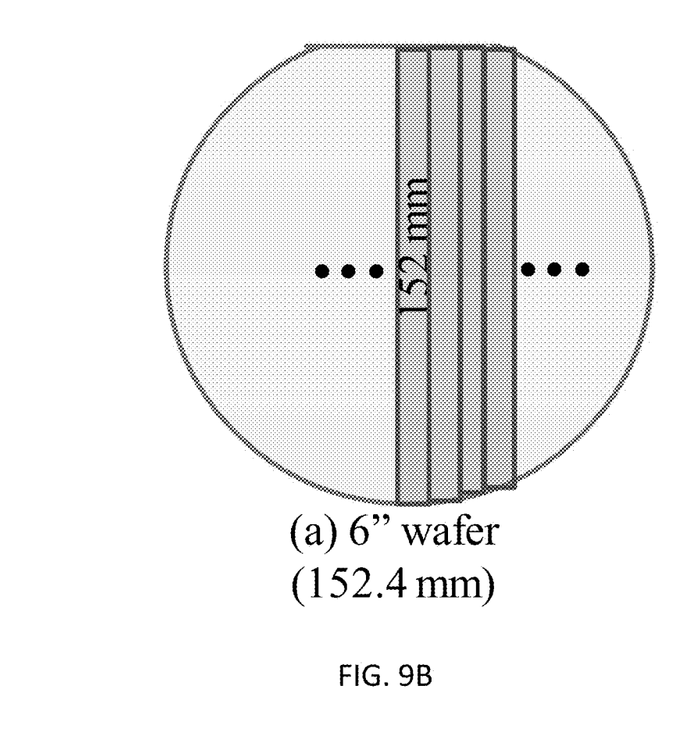

As shown schematically in FIGS. 9A-9B, the longest detector 902 that can be fabricated from 4-inch wafers 904 is about 10 cm, whereas the longest detector 906 that can be fabricated from 6-inch wafers 908 is about 15 cm. However, a single wafer can be diced into many strips with the same width and different lengths as schematically illustrated in FIG. 9B. One could continue to extend the length of the detector by attach many strips together to achieve a very large detection area and high detection sensitivity.

Figure 10A:
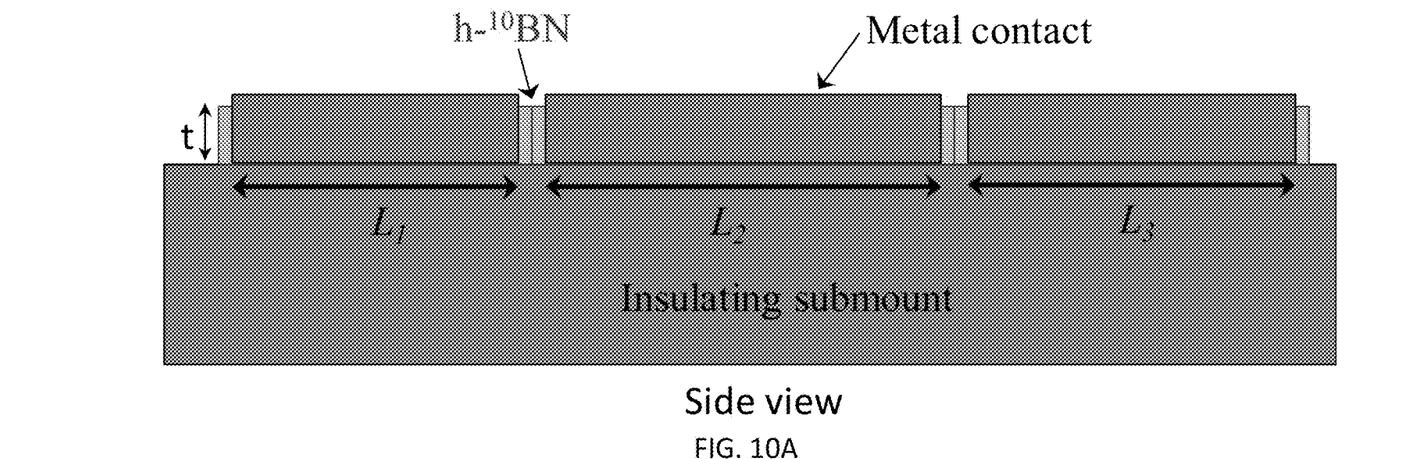
FIGS. 10A-10C are cross-sectional, side and top views, respectively of many lateral $^{10}$BN neutron detectors of the same width but different lengths to obtain a large detector size and provide a high detection sensitivity in accordance with one embodiment of the present invention.
Figure 10B:
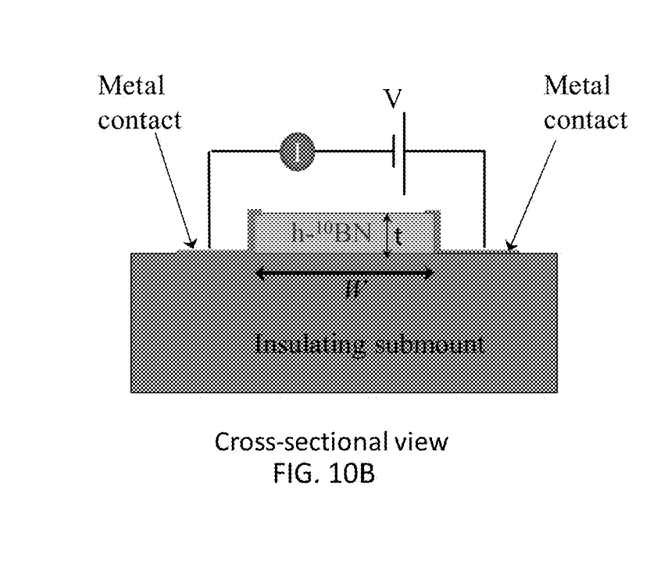
Figure 10C:
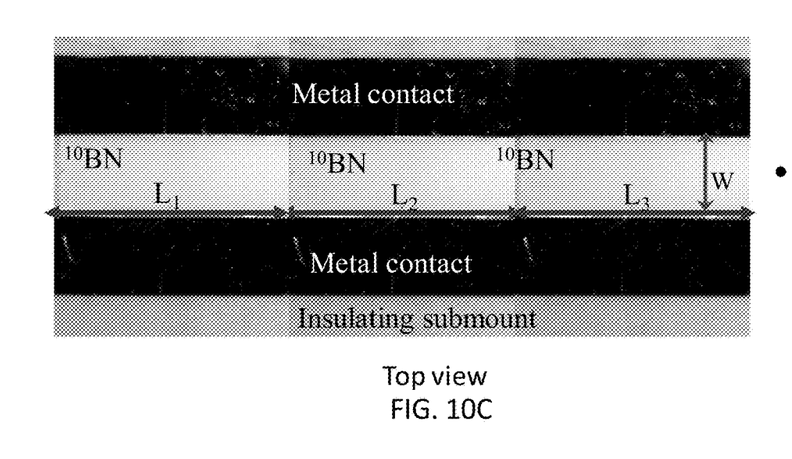

FIGS. 10A-10C are cross-sectional, side and top views, respectively of many lateral $^{10}$BN neutron detectors $600_{1-3}$ of the same width W but different lengths $L_1, L_2, L_3$ to obtain a large detector size and provide a high detection sensitivity in accordance with one embodiment of the present invention. The $^{10}$BN neutron detector 1000 is made up of two or more individual $^{10}$BN neutron detectors 600. Note that the number of individual $^{10}$BN neutron detectors used for the large detector 1000 can be more or less than the example shown in FIGS. 10A-10C. Moreover, the lengths of all the detectors $600_{1-3}$ can be the same.

The first laterally oriented neutron detector $600_1$ includes an electrically insulating submount 604, a BN epilayer $602_1$ placed on the insulating submount 604, a first metal contact $606_1$ deposited on a first surface (side) of the BN epilayer $602_1$, and a second metal contact $608_1$ deposited on a second surface (opposite side) of the BN epilayer $602_1$. The BN epilayer $602_1$ is Boron-10 enriched hexagonal boron nitride having a thickness (t), a width (W) and a length ($L_1$). The first metal contact $606_1$ and the second metal contact $608_1$ each overlaps a top edge 610 of the BN epilayer $602_1$.

The second laterally oriented neutron detector $600_2$ includes an electrically insulating submount 604, a BN epilayer $602_2$ placed on the insulating submount 604, a first metal contact $606_2$ deposited on a first surface (side) of the BN epilayer $602_2$, and a second metal contact $608_2$ deposited on a second surface (opposite side) of the BN epilayer $602_2$. The BN epilayer $602_2$ is Boron-10 enriched hexagonal boron nitride having a thickness (t), a width (W) and a length ($L_2$). The first metal contact $606_2$ and the second metal contact $608_2$ each overlaps a top edge 610 of the BN epilayer $602_2$.

The third laterally oriented neutron detector $600_3$ includes an electrically insulating submount 604, a BN epilayer $602_3$ placed on the insulating submount 604, a first metal contact $606_3$ deposited on a first surface (side) of the BN epilayer $602_3$, and a second metal contact $608_3$ deposited on a second surface (opposite side) of the BN epilayer $602_3$. The BN epilayer $602_3$ is Boron-10 enriched hexagonal boron nitride having a thickness (t), a width (W) and a length ($L_3$). The first metal contact $606_3$ and the second metal contact $608_3$ each overlaps a top edge 610 of the BN epilayer $602_3$.

A measurement circuit 506 is connected to the first metal contacts $606_{1-3}$ and the second metal contacts $608_{1-3}$. The first metal contacts $606_{1-3}$ and the second metal contacts $608_{1-3}$ can be deposited using an electron-beam evaporation, thermal evaporation, electroplating or pasting process. The thickness of the BN epilayers $602_{1-3}$ can be from about a few microns to greater than 300 μm. The neutron detector 1000 can have one or more characteristics, such as an operating voltage less than about 500 V, an operating temperature between about −200 and 500 C, a gamma rejection ratio of about $1 \times 10^{-6}$, or an energy resolution of about 3%. In some embodiments, the operating voltage less than about 100 V or the gamma rejection ratio is better than about $1 \times 10^{-4}$.

In the scenarios where shorter detectors are desired, an alternative approach is to connect multiple lateral detectors in parallel so that the total detection sensitivity (or count rate) of the detector array is obtained by summing up signals from all detectors in the parallel circuit. In such a case, the large $^{10}$BN neutron detector would be made up of two or more individual $^{10}$BN neutron detectors 600 placed onto the electrically insulating submount in a parallel configuration.

Figure 11:
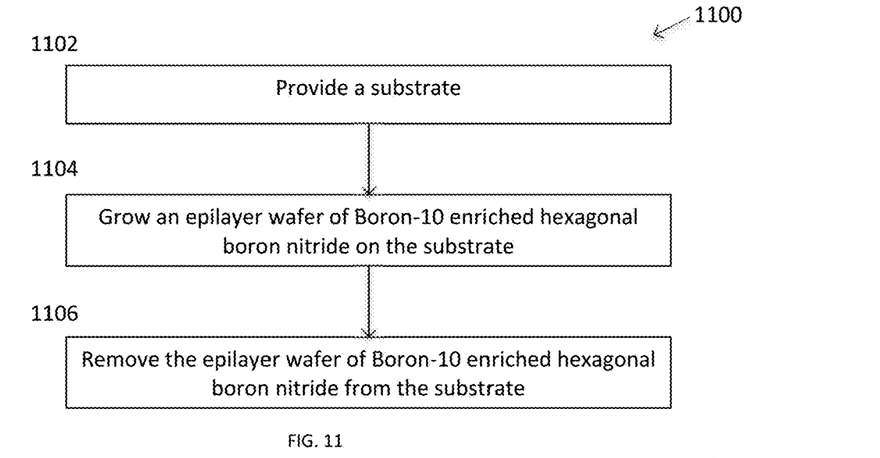
FIG. 11 is a flowchart of a method for fabricating a single crystal epilayer wafer in accordance with one embodiment of the present invention.

FIG. 11 is a flowchart of a method 1100 for fabricating an epilayer wafer of Boron-10 enriched hexagonal boron nitride in accordance with one embodiment of the present invention. A substrate is provided in block 1102, the epilayer wafer of Boron-10 enriched hexagonal boron nitride is grown on the substrate in block 1104, and the epilayer wafer of Boron-10 enriched hexagonal boron nitride is removed from the substrate in block 1106. The epilayer wafer of Boron-10 enriched hexagonal boron nitride can be removed from the substrate by cooling the epilayer wafer of Boron-10 enriched hexagonal boron nitride and the substrate such that a difference in thermal expansion coefficients between the epilayer wafer of Boron-10 enriched hexagonal boron nitride and the substrate automatically separates the epilayer wafer of Boron-10 enriched hexagonal boron nitride from the substrate. Note that the epilayer wafer of Boron-10 enriched hexagonal boron nitride is flexible.

Figure 12:
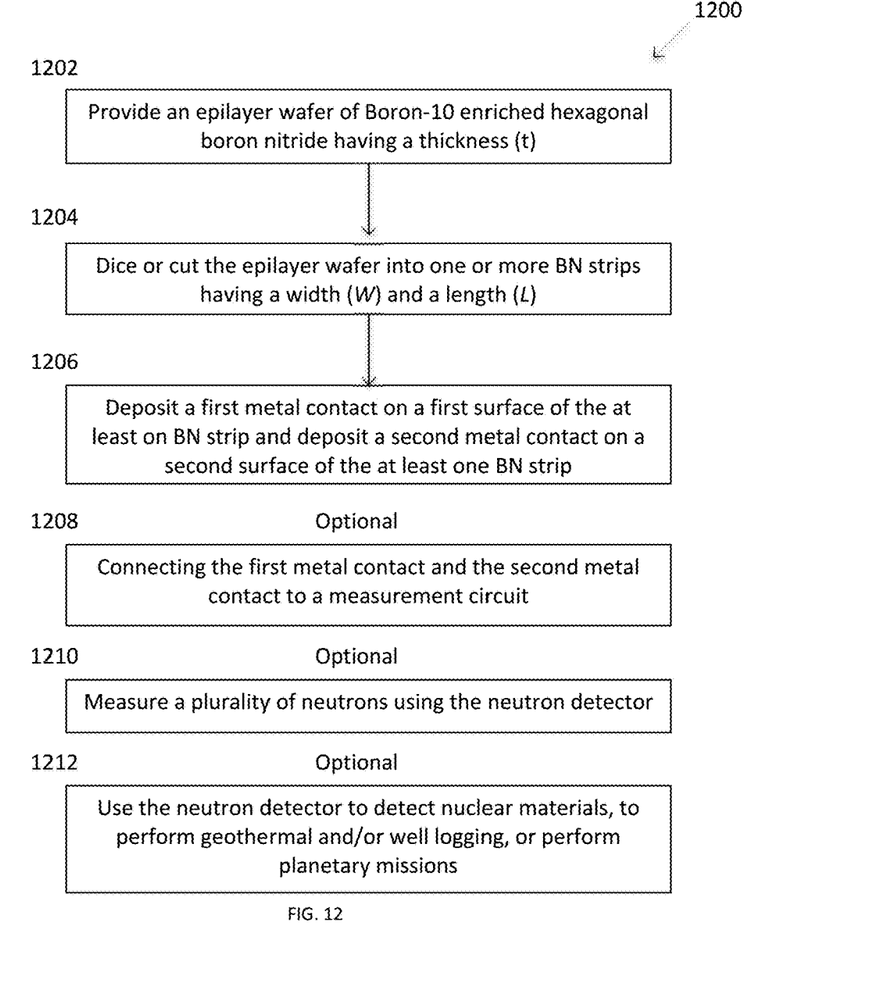
FIG. 12 is a flowchart of a method for fabricating a neutron detector in accordance with one embodiment of the present invention.

FIG. 11 is a flowchart of a method 1200 for fabricating a neutron detector in accordance with one embodiment of the present invention. An epilayer wafer of Boron-10 enriched hexagonal boron nitride having a thickness (t) is provided in block 1202. The epilayer wafer is diced or cut into one or more BN strips having a width (W) and a length (L) in block 1204. A first metal contact is deposited on a first surface of the at least one BN strip and a second metal contact is deposited on a second surface of the at least one BN strip in block 1206.

Optional steps include connecting the first metal contact and the second metal contact to a measurement circuit in block 1208, measuring a plurality of neutrons using the neutron detector in block 1210, and using the neutron detector to detect nuclear materials, to perform geothermal and/or well logging, or perform planetary missions in block 1212.

The method 1200 can be used to fabricate a lateral oriented neutron detector by placing the at least one BN strip onto an electrically insulating submount prior to depositing the first metal contact and the second metal contact. The first surface comprises a side of the at least one BN strip and the second surface comprises an opposite side of the at least one BN strip. The first metal contact and the second metal contact can each overlaps a top edge of the at least one BN strip.

The method 1200 can be used to fabricate a long neutron detector by repeating the placing step and depositing step such that a plurality of BN strips are placed end to end onto the electrically insulating submount in a series configuration. Each BN strip has the width (W) and at least two lengths ($L_1$, $L_2$). Alternatively, each BN strip can have the same length.

The method 1200 can be used to fabricate a short neutron detector by repeating the placing step and depositing step such that a plurality of the neutron detectors are placed onto the electrically insulating submount in a parallel configuration.

The method 1200 can be used to fabricate a vertically oriented neutron detector by depositing a first metal contact onto the first surface comprising a bottom surface of the at least one BN strip, and depositing the second metal contact onto the second surface comprising a top surface of the at least one BN strip.

The first metal contacts $606_{1-3}$ and the second metal contacts $608_{1-3}$ can be deposited using an electron-beam evaporation, thermal evaporation, electroplating or pasting process. The thickness of the BN epilayers $602_{1-3}$ can be from about several microns to greater than 300 The neutron detector 1000 can have one or more characteristics, such as an operating voltage less than about 500 V, an operating temperature between about −200 and 500 C, a gamma rejection ratio of about $1\times10^{-6}$, or an energy resolution of about 3%. In some embodiments, the operating voltage less than about 100 V or the gamma rejection ratio is better than about $1\times10^{-4}$.

It will be understood that particular embodiments described herein are shown by way of illustration and not as limitations of the invention. The principal features of this invention can be employed in various embodiments without departing from the scope of the invention. Those skilled in the art will recognize, or be able to ascertain using no more than routine experimentation, numerous equivalents to the specific procedures described herein. Such equivalents are considered to be within the scope of this invention and are covered by the claims.

All publications and patent applications mentioned in the specification are indicative of the level of skill of those skilled in the art to which this invention pertains. All publications and patent applications are herein incorporated by reference to the same extent as if each individual publication or patent application was specifically and individually indicated to be incorporated by reference.

The use of the word "a" or "an" when used in conjunction with the term "comprising" in the claims and/or the specification may mean "one," but it is also consistent with the meaning of "one or more," "at least one," and "one or more than one." The use of the term "or" in the claims is used to mean "and/or" unless explicitly indicated to refer to alternatives only or the alternatives are mutually exclusive, although the disclosure supports a definition that refers to only alternatives and "and/or." Throughout this application, the term "about" is used to indicate that a value includes the inherent variation of error for the device, the method being employed to determine the value, or the variation that exists among the study subjects.

As used in this specification and claim(s), the words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps. In embodiments of any of the compositions and methods provided herein, "comprising" may be replaced with "consisting essentially of" or "consisting of". As used herein, the phrase "consisting essentially of" requires the specified integer(s) or steps as well as those that do not materially affect the character or function of the claimed invention. As used herein, the term "consisting" is used to indicate the presence of the recited integer (e.g., a feature, an element, a characteristic, a property, a method/process step or a limitation) or group of integers (e.g., feature(s), element(s), characteristic(s), property(ies), method/process steps or limitation(s)) only.

The term "or combinations thereof" as used herein refers to all permutations and combinations of the listed items preceding the term. For example, "A, B, C, or combinations thereof" is intended to include at least one of: A, B, C, AB, AC, BC, or ABC, and if order is important in a particular context, also BA, CA, CB, CBA, BCA, ACB, BAC, or CAB. Continuing with this example, expressly included are combinations that contain repeats of one or more item or term, such as BB, AAA, AB, BBC, AAABCCCC, CBBAAA, CABABB, and so forth. The skilled artisan will understand that typically there is no limit on the number of items or terms in any combination, unless otherwise apparent from the context.

As used herein, words of approximation such as, without limitation, "about", "substantial" or "substantially" refers to a condition that when so modified is understood to not necessarily be absolute or perfect but would be considered close enough to those of ordinary skill in the art to warrant designating the condition as being present. The extent to which the description may vary will depend on how great a change can be instituted and still have one of ordinary skill in the art recognize the modified feature as still having the required characteristics and capabilities of the unmodified feature. In general, but subject to the preceding discussion, a numerical value herein that is modified by a word of approximation such as "about" may vary from the stated value by at least ±1, 2, 3, 4, 5, 6, 7, 10, 12 or 15%.

All of the compositions and/or methods disclosed and claimed herein can be made and executed without undue experimentation in light of the present disclosure. While the compositions and methods of this invention have been described in terms of preferred embodiments, it will be apparent to those of skill in the art that variations may be applied to the compositions and/or methods and in the steps or in the sequence of steps of the method described herein without departing from the concept, spirit and scope of the invention. All such similar substitutes and modifications apparent to those skilled in the art are deemed to be within the spirit, scope and concept of the invention as defined by the appended claims.

To aid the Patent Office, and any readers of any patent issued on this application in interpreting the claims appended hereto, applicants wish to note that they do not intend any of the appended claims to invoke paragraph 6 of 35 U.S.C. § 112, U.S.C. § 112 paragraph (f), or equivalent, as it exists on the date of filing hereof unless the words "means for" or "step for" are explicitly used in the particular claim.

For each of the claims, each dependent claim can depend both from the independent claim and from each of the prior dependent claims for each and every claim so long as the prior claim provides a proper antecedent basis for a claim term or element.

REFERENCES

1. W. A. Noonan, Johns Hopkins Apl. Technical Digest 32, 762 (2014).
2. J. Neal, L. Boatner, Z. Bell, H. Akkurt, and M. McCarthy, "Evaluation of neutron and gamma detectors for high-temperature well-logging applications," in *Future of Instrumentation International Workshop (FIIW)* (2011), pp. 172-175.
3. I. Jun, I. Mitrofanov, M. L. Litvak, A. B. Sanin, W. Kim, A. Behar, W. V. Boynton, L. DeFlores, F. Fedosov, D. Golovin, C. Hardgrove, K. Harshman, A. S. Kozyrev, R. O. Kuzmin, A. Malakhov, M. Mischna, J. Moersch, M. Mokrousov, S. Nikiforov, V. N. Shvetsov, C. Tate, V. I. Tret'yakov, and A. Vostrukhin, J. Geophysical Research: Planets 118, 11 (2013).
4. G. F. Knoll, "Radiation detection and measurement," 4th edition, (John Wiley & Sons, 2010).
5. Q. Shao, L. F. Voss, A. M. Conway, R. J. Nikolic, M. A. Dar, and C. L. Cheung, Appl. Phys. Lett. 102, 063505 (2013).
6. S. L. Bellinger, R. G. Fronk, W. J. McNeil, T. J. Sobering, and D. S. McGregor, IEEE Trans. Nucl. Sci. 59, 167 (2012).
7. S. L. Bellinger, R. G. Fronk, T. J. Sobering, and D. S. McGregor, "High-efficiency microstructured semiconductor neutron detectors that are arrayed, dual-integrated, and stacked," Applied Radiation and Isotopes 70, 1121 (2012).
8. A. M. Conway, R. J. Nikolic, and T. F. Wang, Proceedings of the International Semiconductor Device Research Conference, IEEE, New York, pp. 589 (2007).
9. Q. Shao, L. F. Voss, A. M. Conway, R. J. Nikolic, M. A. Dar, and C. L. Cheung, Appl. Phys. Lett. 102, 063505 (2013).
10. K. C Huang, R. Dahal, J. J. Q. Lu, A. Weltz, Y. Danon, and I. B. Bhat, Nucl. Instrum. Methods Phys. Res. A 763, 260 (2014).
11. U.S. Pat. No. 8,778,715B2, "Method of fabricating a neutron detector such as a microstructured semiconductor neutron detector." Steven L. Bellinger, Ryan G. Fronk, Douglas S. McGregor.
12. U.S. Pat. No. 7,164,138, "High-efficiency neutron detectors and methods of making the same." Douglas S. McGregor and Raymond Klann.
13. U.S. Pat. No. 8,778,715, "Method of fabricating a neutron detector such as a microstructured semiconductor neutron detector." Steven L. Bellinger, Ryan G. Fronk, and Douglas S. McGregor.
14. U.S. Pat. No. 8,558,188, "Method for manufacturing solid-state thermal neutron detectors with simultaneous high thermal neutron detection efficiency (>50%) and neutron to gamma discrimination (>1.0E4)." Rebecca J. Nikolic, Adam M. Conway, Daniel Heineck, Lars F. Voss, Tzu Fang Wang, Qinghui Shao.
15. U.S. Pat. No. 9,151,853B2, "Neutron-detecting apparatuses and fabrication methods." Rajendra P. Dahal, Jacky Kuan-Chih Huang, James J. Q. Lu, Yaron Danon, and Ishwara B. Bhat
16. U.S. Pat. No. 9,810,794, "Fabricating radiation-detecting structures." Rajendra P. Dahal, Ishwara B. Bhat, Yaron Danon, James Jian-Qiang Lu.
17. K. Osberg, N. Schemm, S. Balkir, J. O. Brand, M. S. Hallbeck, P. A. Dowben, and M. W. Hoffman, IEEE Sensor J. 6 1531 (2006).
18. Y. B. Losovyj, I. Ketsman, A. Sokolov, K. D. Belashchenko, P. Dowben, J. Tang, and, Z. Wang, Appl. Phys. Lett 9, 1132908 (2007).
19. D. S. McGregor, T. C. Unruh, and W. J. McNeil, Nucl. Instrum. Methods Phys. Res. A 591, 530 (2008).
20. A. N. Caruso, J. Physics: Condensed Matter 22, 443201 (2010).
21. U.S. Pat. No. 6,727,504, "Boron nitride solid-state neutron detector." F. P. Doty.
22. J. Uher, S. Pospisil, V. Linhart, and M. Schiebar, Appl. Phys. Lett. 90, 124101 (2007).
23. U.S. Pat. No. 9,093,581, "Structures and devices based on boron nitride and boron nitride-III-nitride heterostructures." Hongxing Jiang, Sashi Majety, Rajedra Dahal, Jing Li, and Jingyu Lin
24. J. Li, R. Dahal, S. Majety, J. Y. Lin, and H. X. Jiang, Nucl. Instrum. Methods Phys. Res. A 654, 417 (2011).
25. T. C. Doan, S. Majety, S. Grenadier, J. Li, J. Y. Lin, and H. X. Jiang, Nucl. Instrum. Methods Phys. Res. A 748, 84 (2014); 783, 121 (2015).
26. T. C. Doan, J. Li, J. Y. Lin, and H. X. Jiang, AIP Advances 6, 075213 (2016).
27. K. Ahmed, R. Dahal, A. Weltz, James J. Q. Lu, Y. Danon, and I. B. Bhat, Appl. Phys. Lett. 110, 023503 (2017).
28. A. Maity, T. C. Doan, J. Li, J. Y. Lin, and H. X. Jiang, Appl. Phys. Lett. 109, 072101 (2016).
29. A. Maity, T. C. Doan, J. Li, J. Y. Lin, and H. X. Jiang, Appl. Phys. Lett. 111, 033507 (2017).
30. A. Maity, S. J. Grenadier, J. Li, J. Y. Lin, and H. X. Jiang, J. Appl. Phys. 123, 044501 (2018).
31. https://publishing.aip.org/publishing/journal-highlights/hexagonal-boron-nitride-semiconductors-enable-cost-effective-detection
32. H. G. Spieler and E. E. Haller, IEEE Trans. on Nucl. Sci., NS-32, 419 (1985).

33. R. Dahal, K. Ahmed, J. Woei Wu, A. Weltz, J. Lu, Y. Danon and I. B. Bhat, Applied Physics Express 9, 065801 (2016).
34. X. K. Cao, B. Clubine, J. H. Edgar, J. Y. Lin, and H. X. Jiang, Appl. Phys. Lett. 103, 191106 (2013).
35. A. Many, J. Phys. Chem. Solids 26, 575 (1965).

What is claimed is:

1. A method for fabricating a neutron detector comprising:
providing an epilayer wafer of Boron-10 enriched hexagonal boron nitride (h-$^{10}$BN or h-BN or $^{10}$BN or BN) having a thickness (t);
dicing or cutting the epilayer wafer into one or more BN strips having a width (W) and a length (L); and
depositing a first metal contact on a first surface of at least one of the BN strips and a second metal contact on a second surface of the at least one BN strip.

2. The method of claim 1, further comprising connecting the first metal contact and the second metal contact to a measurement circuit.

3. The method of claim 2, further comprising measuring a plurality of neutrons using the neutron detector.

4. The method of claim 3, further comprising using the neutron detector to detect nuclear materials, to perform geothermal and/or well logging, or perform planetary missions.

5. The method of claim 1, further comprising:
placing the at least one BN strip onto an electrically insulating submount prior to depositing the first metal contact and the second metal contact; and
wherein the first surface comprises a side of the at least one BN strip and the second surface comprises an opposite side of the at least one BN strip such that the neutron detector comprises a lateral oriented neutron detector.

6. The method of claim 5, wherein the first metal contact and the second metal contact each overlaps a top edge of the at least one BN strip.

7. The method of claim 5, further comprising repeating the placing step and depositing step such that a plurality of BN strips are placed end to end onto the electrically insulating submount in a series configuration.

8. The method of claim 5, further comprising repeating the placing step and depositing step such that a plurality of the neutron detectors are placed onto the electrically insulating submount in a parallel configuration.

9. The method of claim 1, wherein depositing the first metal contact on the first surface of the at least one BN strip and the second metal contact on the second surface of the at least one BN strip comprises:
depositing a first metal contact onto the first surface comprising a bottom surface of the at least one BN strip; and
depositing the second metal contact onto the second surface comprising a top surface of the at least one BN strip such that the neutron detector comprises a vertical oriented neutron detector.

10. The method of claim 1, wherein depositing the first metal contact on the first surface of the at least one BN strip and the second metal contact on the second surface of the at least one BN strip is preformed using an electron-beam evaporation, thermal evaporation, electroplating or pasting process.

11. The method of claim 1, wherein the one or more BN strips comprise at least two strips, each strip having the width (W) and at least two lengths ($L_1$, $L_2$).

12. The method of claim 1, wherein the thickness of the epilayer wafer comprises several microns to greater than 300 μm.

13. The method of claim 1, wherein providing the epilayer wafer comprises:
providing a substrate;
growing the epilayer wafer on the substrate; and
removing the epilayer wafer from the substrate.

14. The method of claim 13, wherein removing the epilayer wafer from the substrate comprises cooling the epilayer wafer and the substrate such that a difference in thermal expansion coefficients between the epilayer wafer and the substrate automatically separates the epilayer wafer from the substrate.

15. The method of claim 1, wherein the epilayer wafer is flexible.

16. The method of claim 1, wherein the neutron detector has one or more characteristics comprising an operating voltage less than about 500 V, an operating temperature between about −200 and 500 C, a gamma rejection ratio of about $1\times10^{-4}$ or better, or an energy resolution of about 3%.

* * * * *